US009159582B2

(12) United States Patent
OuYang et al.

(10) Patent No.: US 9,159,582 B2
(45) Date of Patent: Oct. 13, 2015

(54) METHODS OF FORMING A SEMICONDUCTOR DEVICE

(75) Inventors: Hui OuYang, Chubei (TW); Jean-Luc Everaert, Gooik (BE); Laura Nyns, Geetbets (BE); Rita Vos, Tremelo (BE)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 391 days.

(21) Appl. No.: 12/261,728

(22) Filed: Oct. 30, 2008

(65) Prior Publication Data

US 2009/0117750 A1    May 7, 2009

(30) Foreign Application Priority Data

Oct. 30, 2007    (EP) .................................... 07119632

(51) Int. Cl.
*H01L 21/00* (2006.01)
*H01L 21/314* (2006.01)
*H01L 21/02* (2006.01)
*H01L 21/316* (2006.01)
(Continued)

(52) U.S. Cl.
CPC ...... *H01L 21/3141* (2013.01); *H01L 21/02057* (2013.01); *H01L 21/28194* (2013.01); *H01L 21/28211* (2013.01); *H01L 21/31645* (2013.01); *H01L 21/31654* (2013.01); *H01L 29/517* (2013.01); *H01L 21/28167* (2013.01); *H01L 29/513* (2013.01)

(58) Field of Classification Search
CPC .................. H01L 21/02057; H01L 21/28167; H01L 21/28194; H01L 21/28211; H01L 21/3141; H01L 21/31645; H01L 21/31654; H01L 29/513; H01L 29/517
USPC .............. 438/3, 240, 287–289, 785–786, 791
See application file for complete search history.

(56) References Cited

U.S. PATENT DOCUMENTS 6,245,311 B1 * 6/2001 Kobayashi et al. ........... 423/348
6,821,873 B2   11/2004 Visokay et al.
(Continued)

FOREIGN PATENT DOCUMENTS

TW        I239390     9/2005
WO        00/59023    10/2000
(Continued)

OTHER PUBLICATIONS

"High-k Gate Dielectrics: Current Status and Materials Properties Considerations," Journal of Applied Physics, May 15, 2001, vol. 89, No. 10, p. 5243-5275, 2001 American Institute of Physics.
(Continued)

*Primary Examiner* — H Tsai
(74) *Attorney, Agent, or Firm* — Slater & Matsil, L.L.P.

(57) ABSTRACT

The present disclosure relates to methods for forming a high-k gate dielectric, the methods comprising the steps of providing a semiconductor substrate, cleaning the substrate, performing a thermal treatment, and performing a high-k dielectric material deposition, wherein said thermal treatment step is performed in a non-oxidizing ambient, leading to the formation of a thin interfacial layer between said semiconductor substrate and said high-k dielectric material and wherein the thickness of said thin interfacial layer is less than 10 Å.

15 Claims, 7 Drawing Sheets

(a)

(b)

(51) Int. Cl.
*H01L 21/28* (2006.01)
*H01L 29/51* (2006.01)

(56) References Cited

U.S. PATENT DOCUMENTS

| | | | |
|---|---|---|---|
| 2001/0037822 A1* | 11/2001 | Elsawy et al. | 134/30 |
| 2002/0058424 A1 | 5/2002 | Rotondaro | |
| 2004/0209412 A1* | 10/2004 | Arao | 438/197 |
| 2004/0241991 A1* | 12/2004 | Aoyama et al. | 438/689 |
| 2004/0266117 A1* | 12/2004 | Hwang | 438/287 |
| 2005/0130442 A1* | 6/2005 | Visokay et al. | 438/775 |
| 2005/0139231 A1* | 6/2005 | Abadie et al. | 134/2 |
| 2005/0161434 A1 | 7/2005 | Sugawara et al. | |
| 2006/0121742 A1* | 6/2006 | Metz et al. | 438/778 |
| 2006/0148143 A1* | 7/2006 | Bedell et al. | 438/162 |
| 2006/0234515 A1* | 10/2006 | Aoyama et al. | 438/758 |
| 2007/0049051 A1 | 3/2007 | Ahn et al. | |
| 2007/0287199 A1* | 12/2007 | Hsu et al. | 438/3 |
| 2008/0237694 A1* | 10/2008 | Specht et al. | 257/324 |

FOREIGN PATENT DOCUMENTS

| | | |
|---|---|---|
| WO | WO 00/59023 A3 | 10/2000 |
| WO | 03/041124 | 5/2003 |
| WO | WO 03/041124 A2 | 5/2003 |
| WO | WO2005/013349 A2 | 2/2005 |
| WO | WO 2007/126482 A2 | 11/2007 |

OTHER PUBLICATIONS

European Search Report for 07119632.3-2203 dated Apr. 24, 2008.

* cited by examiner

METHODS OF FORMING A SEMICONDUCTOR DEVICE

PRIORITY

This application claims priority to application EP 07119632.3 filed on Oct. 30, 2007, the entirety of which is hereby incorporated by reference.

FIELD

The present disclosure is related to the field of integrated circuit (IC) fabrication.

More precisely, the present disclosure is related to methods for depositing a high-k dielectric material on a substrate thereby providing a suitable interface layer for high-k material deposition.

In particular, the present disclosure concerns methods for depositing high-k dielectric materials when making gate dielectric structures.

BACKGROUND

At present, there is a great demand for shrinking (or scaling) semiconductor devices to provide an increased density of devices on the semiconductor chip that are faster and consume less power.

$SiO_2$ has been the most used gate dielectric material of semiconductor devices. However, scaling the thickness of $SiO_2$ for gate dielectric applications has placed severe limitations on the oxidation process. Sub-angstrom uniformity across the wafer and thickness control are necessary requirements to use these dielectric materials.

Furthermore, as the thickness of the dielectric layer is reduced, quantum tunneling effects tend to increase, allowing an electric current to flow between the gate and the channel. This tunneling current is undesirable.

Recent efforts involving device scaling have focused on alternative dielectric materials which can be formed in a thicker layer than for example scaled $SiO_2$ layers and yet still produce the same field effect performance. These materials are often referred to as high-k materials because their dielectric constants are higher than that of $SiO_2$ (dielectric constant k of $SiO_2$ being 3.9).

The relative performance of such high-k materials is often expressed as Equivalent Oxide Thickness (EOT), because the alternative material layer may be thicker, while still providing the equivalent electrical effect of a much thinner layer of $SiO_2$.

But, a drawback of using higher k dielectric materials is that they tend to provide poor quality interfaces. This poor quality of the interface tends to impair the electrical performance of the resultant gate electrode microstructure in those instances in which a higher k dielectric material is deposited directly onto the silicon substrate.

Therefore, as described in patent WO 2005/013349, dielectric materials, such as $SiO_2$ or the like, can provide a buffer (or interface or bridge) between a semiconductor wafer and a high-k dielectric material to improve electrical performance when using high-k dielectric materials.

Unfortunately, it has been very difficult to develop extremely thin interfacial layers (e.g. those having a thickness below about 10 angstroms) with desired uniformity characteristics.

This lack of uniformity can impair electrical properties of the resultant devices.

In order to integrate high-k materials into current CMOS processing schemes, an interfacial layer of good quality (being flat, smooth, and uniform, and showing continuous interfacial oxide growth) would be beneficial between the semiconductor substrate and the deposited high-k material.

One challenge is to optimize this quality of the interface between a semiconductor wafer substrate (especially silicon wafer substrates) and the higher k dielectric material, upon which the performance and the reliability of the resultant transistors depend.

SUMMARY

The present disclosure describes improved and alternative methods which do not present the drawbacks of known techniques.

The present disclosure describes methods which are particularly advantageous for producing a uniform ultrathin interfacial layer suitable for deposition of dielectric materials with high permittivity (i.e. high-k materials).

Furthermore, the present disclosure describes methods to improve the interface between a semiconductor substrate (or wafer) and a dielectric layer, in particular a high-k dielectric material deposited thereon.

One embodiment of the disclosed methods is a method for forming a high-k gate dielectric, comprising the steps of providing a semiconductor substrate, cleaning the substrate, performing a thermal treatment, and performing a high-k dielectric material deposition for forming the gate dielectric, wherein said thermal treatment step is performed in a non-oxidizing ambient, leading to the formation of a thin interfacial layer between said high-k dielectric material and said semiconductor substrate.

In one embodiment, said step of cleaning the substrate preferably comprises a HF-last treatment (also referred to as IMEC-foob treatment).

In another embodiment, said thermal treatment step may be performed at a temperature higher than 700° C. Alternatively, said thermal treatment step may be performed at a temperature higher than 1000° C. Preferably, said thermal treatment step may be performed at a temperature higher than 1050° C.

In another embodiment, said non-oxidizing ambient comprises an inert gas. Preferably, said non-oxidizing ambient comprises He and/or Ar.

In an alternative embodiment, a proportion of H2 may be added to the non-oxidizing ambient.

Alternatively, said proportion of said $H_2$ gas may be by volume less than or equal to 10%. Preferably, said proportion of said $H_2$ gas is by volume comprised between 1 and 10%.

In one embodiment, $N_2$ is excluded from said non-oxidizing ambient.

In another embodiment, the duration of said thermal treatment step may be less than 2 minutes. Alternatively, the duration of said thermal treatment step may be less than 1 minute. Preferably, the duration of said thermal treatment step is less than 40 seconds.

In one embodiment, said thermal treatment step is followed by a step of forming a thin chemical oxide layer.

In another embodiment, said thin chemical oxide layer may be formed by performing a wet O3/DIW-last treatment (also referred to as IMEC-clean treatment) or a UV-enhanced oxide growth method.

In one embodiment, said high-k dielectric material may be any dielectric material with a dielectric constant, k, higher than the dielectric constant of $SiO_2$.

In one embodiment, said high-k dielectric material may be deposited by Atomic Layer Deposition (ALD).

In one embodiment, the step of depositing the high-k dielectric material is followed by a post deposition anneal step.

Preferably, the thickness of said thin interfacial layer is less than 0.6 nm.

The method according to the present invention may be used for fabricating a semiconductor device incorporating a high-k gate dielectric.

Preferably, said semiconductor device incorporates a high-k gate dielectric comprising a thin interfacial layer of less than 0.6 nm.

DETAILED DESCRIPTION OF THE FIGURES

Figure 1:
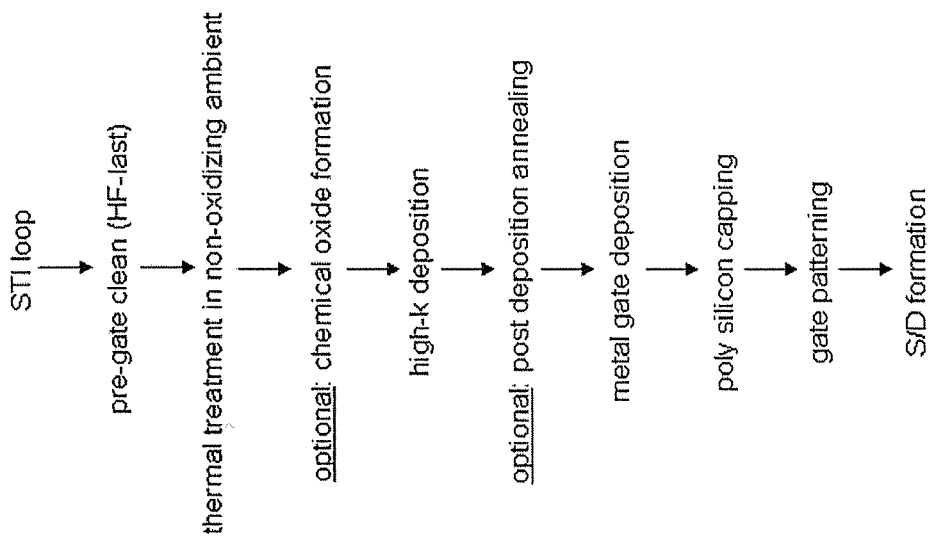
FIG. 1 represents the process flow for surface preparation according to embodiment of the disclosed invention.

Execution of the disclosed methods, comprising a thermal treatment in a non-oxidizing ambient comprising an inert gas, yields the unexpected result of forming a thin interfacial layer (IL).

The term "non-oxidizing ambient" as used in the disclosure means an oxygen-free ambient. Said ambient preferably comprises an inert gas ambient or mixture and optionally other additives.

More particularly, adding $H_2$ to the non-oxidizing ambient comprising an inert gas ambient or mixture leads to increasing the surface smoothening of said thin interfacial layer.

In one disclosed method, said thermal treatment is performed after cleaning the substrate and prior to the deposition of a high-k dielectric material.

The term "high-k dielectric" as used in the present disclosure denotes any dielectric material having a dielectric constant (relative to a vacuum), k, higher than 3.9 (which is the dielectric constant of $SiO_2$) and more preferably having a dielectric constant higher than 8.0.

Performing said thermal treatment in a non-oxidizing ambient comprising an inert gas results in the formation of a thin interfacial layer.

Said interfacial layer may contain silicon oxides and sub-oxides ($SiO_x$ with $0<x\leq2$).

At least one novel aspect of the disclosed methods is that a uniform (smooth or flat) thin (having a thickness below about 10 angstroms) interfacial layer is formed exhibiting reasonable leakage and enhancing mobility of the charge carriers whereas using prior techniques, a low quality interfacial layer (being rough (neither flat, nor smooth, nor uniform) and showing no continuous interfacial oxide growth) is generated, yielding higher leakage and higher interface trap density ($D_{it}$), and as a consequence, low performance semiconductor devices.

It is known that native oxide is growing on the bare Si substrate when exposed to ambient atmosphere comprising oxygen.

This native oxide layer is essentially a heterogeneous mixture of SiO and $SiO_2$.

The quality and thickness of this native oxide layer is inconsistent across the substrate surface and, as such, these native oxide films on Si surfaces prevent the precise control of the thickness of ultrathin gate oxide films.

Therefore, the substrate is cleaned of, among other things, native oxide, to avoid contamination and produce superior electrical properties.

Usually, cleaning the substrate comprises a HF-last hydrophobic treatment, suppressing the oxygen radical to combine with silicon.

Said HF-last hydrophobic treatment, also called IMEC-foob, is based on an oxidation step using ozone and deionized water ($O_3$/DIW) followed by an oxide removal step (using HF/HCl). At the end, a deionized-water rinse (DIW with HCl spiking) followed by Marangoni drying with isopropyl alcohol and nitrogen (IPA/$N_2$) is applied.

Said HF-last (IMEC-foob) treatment results in an oxide free surface.

But, said oxide-free surface generated after said HF-last (IMEC-foob) clean does not provide the proper OH-bond termination suitable for further depositing a high-k material.

In one embodiment, a thermal treatment in a non-oxidizing ambient may be performed after said cleaning step of the substrate.

Said thermal treatment leads to the formation of a uniform thin interfacial layer of oxides and/or suboxides, located between said gate dielectric and said semiconductor substrate.

Said thin interfacial oxide/sub-oxides layer, resulting from performing said thermal treatment in a non-oxidizing ambient, is defined as a thin interfacial layer in inert ambient.

In FIG. 1, a flowchart illustrates the sequence of the different steps in a semiconductor manufacturing process according to a method of the disclosed invention.

The method may comprise forming isolation structures such as Shallow Trench Isolation (STI) structures in a semiconductor body.

Gate fabrication begins where a HF-last hydrophobic (IMEC-foob) treatment is performed to clean a top surface of the semiconductor body before performing the thermal treatment in a non-oxidizing ambient.

Performing said thermal treatment step in a non-oxidizing ambient comprising an inert gas yields a high quality thin interfacial layer formed over the semiconductor body.

Then, a chemical oxide is optionally formed by performing either said wet $O_3$/DIW-last cleaning treatment (also called IMEC-clean) or said UV-enhanced oxide growth method, leaving the surface with a thin chemical oxide layer.

After the interface layer has been formed, the method proceeds where a high-k gate dielectric is deposited over the interface layer. The high-k gate dielectric can comprise one or more layers of high-k dielectric material.

The high-k dielectric material deposition is optionally followed by a post deposition anneal.

A conductive metal gate contact (or gate electrode) is then formed over the high-k gate dielectric, thereby forming the gate structure or gate stack.

The gate electrode may comprise one or more layers of conductive material.

Furthermore, a polysilicon capping layer is deposited over the gate contact.

The gate contact, the (high-k) gate dielectric, and the interface layer are then patterned to form a gate structure.

Source/drain regions of the semiconductor body are provided with appropriate n or p dopants through implantation and diffusion, and interconnect processing is performed.

In the case of shallow-trench-isolation, grooves formed by dry-etch in the substrate are filled with a dielectric material providing electrical insulation.

The gate dielectric can be a high-k dielectric material such as a hafnium oxide, an aluminium oxide, or a zirconium oxide.

The gate electrode (or gate contact) can be formed from a semiconductor material such as polysilicon, silicon-germanium, germanium, metal silicides or from a metallic material selected from the group consisting of metals, metal nitrides, metal carbonitrides, and combinations thereof (e.g. Ti, Ta, W, Ru, Ti(C)N, Ta(C)N, W(C)N).

A gate structure separates in a lateral direction the source electrode and the drain electrode, which contact at opposite lateral sides the channel region.

Against the gate structure, dielectric sidewall spacers can be formed to offset the source and drain regions from the channel region. These sidewall spacers may be formed for example from silicon-oxide, silicon-nitride, and/or silicon-carbide.

According to a preferred embodiment, a method for forming a high-k gate dielectric comprises the steps of providing a semiconductor substrate, cleaning the substrate, performing a thermal treatment in a non-oxidizing ambient and then performing a high-k dielectric material deposition.

In one embodiment, performing said thermal treatment in a non-oxidizing ambient, further comprising an inert gas mixture, leads to the formation of a thin interfacial layer.

Furthermore, said uniform thin interfacial layer, as a result of the applied thermal treatment, has the suitable surface terminations and thus makes the surface compatible with high-k material deposition and minimizes the EOT.

Said uniform thin interfacial layer provides improved interface characteristics between the silicon structure and the high-k dielectric material deposited in the following deposition step.

Said thermal treatment in a non-oxidizing ambient comprising an inert gas mixture is preferably performed in a Rapid Thermal Process (RTP) chamber.

Said thermal treatment is preferably performed at a temperature higher than 700° C., more preferably higher than 1000° C. and preferably higher than 1050° C.

The duration of said thermal treatment may be less than 2 minutes. Alternatively, the duration of said thermal treatment is less than 1 minute. Preferably, the duration of said thermal treatment is less than 40 seconds.

In one embodiment, the thermal treatment may be performed in a furnace (e.g. LPCVD Low Pressure Chemical Vapor Deposition reactor) or using a spike anneal. When performed in a LPCVD reactor, the thermal treatment requires longer duration (at least 10 minutes up to several hours), while the spike anneal takes typically 1 s at approximately 1050° C.

During the thermal treatment, a uniform thin layer comprising silicon oxides and sub-oxides ($SiO_x$ with $0<x\leq2$) is unraveled on the substrate surface.

Said inert gas in said non-oxidizing ambient used during said thermal treatment is preferably He and/or Ar.

$N_2$ gas is not appropriate to be added to the non-oxidizing ambient as it would incorporate at the interface and increase interface state density leading to degradation of the channel mobility, affecting in this way the electrical characteristics of the device.

Preferably, a proportion of $H_2$ is added to the non-oxidizing ambient comprising said inert gas.

Preferably the proportion of the $H_2$ gas is by volume less than 10%, and more preferably comprised between 1 and 10%.

Preferably, the pressure of the non-oxidizing ambient is comprised between 10 and 20 torr.

As such, the method according to the invention is used for obtaining a thickness of the thin interfacial layer being less than 0.6 nm.

The disclosed methods are useful for obtaining a good quality interfacial layer being flat (or smooth or uniform) and showing continuous interfacial oxide growth.

In one embodiment, the formation of said thin interfacial layer is followed by the deposition of a high-k dielectric material.

Said high-k dielectric material may be deposited using any deposition techniques known in the art, and preferably using Atomic Layer Deposition (ALD), Metal-Organic Chemical Vapor Deposition (MOCVD), Molecular Beam Epitaxy (MBE), Chemical Vapor Deposition (CVD), or Physical Vapor Deposition (PVD).

Examples of high-k materials include, but are not limited to, binary metal oxides including $ZrO_2$, $HfO_2$, $La_2O_3$, $Y_2O_3$, $TiO_2$, as well as their silicates and aluminates; metal oxynitrides including AlON, ZrON, HfON, LaON, YON, as well as their silicates and aluminates such as ZrSiON, HfSiON, LaSiON, YsiON etc.; and perovskite type oxides including a titanate system material such as barium titanate, strontium titanate, barium strontium titanate $(BaSr)TiO_3$ (BST).

Preferably, the high-k material deposition is optionally followed by a post deposition anneal step further lowering the Interface Trap Density ($D_{it}$).

In one embodiment, the high-k material deposition step is immediately performed after performing said thermal treatment in a non-oxidizing ambient.

In another embodiment, a chemical oxide growth step is optionally performed after performing said thermal treatment in a non-oxidizing ambient.

Chemically growing oxide involves contacting a bare semiconductor surface, and more preferably said thin interfacial layer, with liquid and/or gaseous chemical(s) that oxidize the surface.

Said chemical oxide is preferably formed by performing either a wet cleaning treatment such as an $O_3$/DIW-last (IMEC-clean) treatment or a UV-enhanced oxide growth, both used now as an alternative to grow a thin chemical oxide layer.

Said wet $O_3$/DIW-last clean, also known as IMEC-clean, is based on an oxidation step using ozone and deionized water ($O_3$/DIW) followed by an oxide removal step (using HF/HCl). At the end, an ozonated deionized-water rinse ($O_3$/DIW with HCl spiking) followed by Marangoni drying with isopropyl alcohol and nitrogen (IPA/$N_2$) is applied.

Said wet $O_3$/DIW-last clean (IMEC-clean) leaves the surface with a very clean thin chemical oxide layer.

Said UV-enhanced oxide growth method consists of growing a thin oxide layer in air under UV radiation. Argon may be flushed continuously over the substrate to slow down the growth rate of the oxide in air.

Said UV-enhanced oxide growth method results in a chemical oxide layer which is thinner than the one formed during the wet $O_3$/DIW-last clean (IMEC-clean) treatment.

Said chemical oxide layer grown by performing said wet $O_3$/DIW-last clean (IMEC-clean) or said UV-enhanced oxide growth method also provide, in addition to the effect caused by performing the thermal treatment, a surface with suitable terminations (e.g. OH-bonds) enabling the following high-k material deposition.

As such, a total oxide layer may be formed which can be divided into two contributions; on the one hand, an interfacial layer yielded, by performing said thermal treatment in said non-oxidizing ambient, and on the other hand, said chemical oxide layer grown by performing either said wet $O_3$/DIW-last clean (IMEC-clean) treatment or said UV-enhanced oxide growth method.

Performing only said chemical oxide growth step without performing a thermal (pre)treatment, yields a leaky, poor quality chemical oxide (cf. FIG. 3 and FIG. 6 discussed below) not suitable for further high-k material deposition and, as a consequence, yielding low quality semiconductor devices.

Then, after said optional chemical oxide formation step, the ALD high-k material deposition step is performed.

Said semiconductor substrate is preferably a silicon substrate or a Silicon-On-Insulator (SOI) substrate comprising a silicon wafer or silicon layer, such as polysilicon, epitaxial silicon or amorphous silicon, with or without dopants for electrical conductivity.

Said semiconductor substrate can be any semiconductor substrate that is resistant at the required high temperatures used according to the disclosed methods.

The substrate may contain various isolation regions such as Shallow Trench Isolation (STI) regions, LOCOS (local oxidation of silicon) regions or other like isolation regions either formed in the substrate or on a surface thereof.

Figure 2:
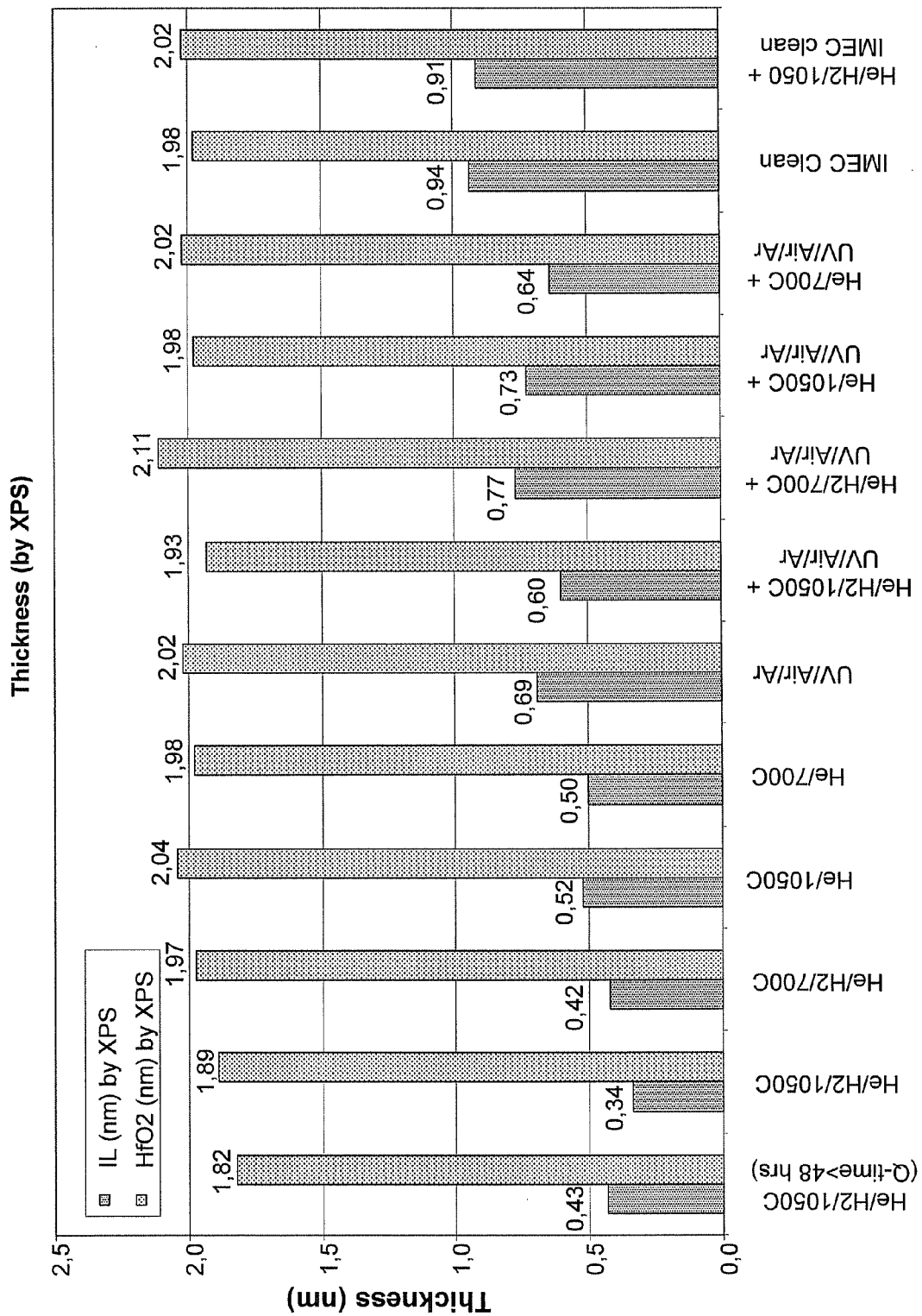
FIG. 2 depicts the thickness measured by Angle Resolved X-Ray Photoelectron Spectroscopy (AR-XPS) for the interfacial layer and for the deposited high-k dielectric material $HfO_2$ for different growth conditions.

FIG. 2 shows the thickness measured by AR-XPS for the interfacial layer and for the deposited high-k dielectric material $HfO_2$ for different surface treatment steps according to the disclosed methods.

The interfacial layer (IL) in FIG. 2 is formed either as a result of said thermal treatment in non-oxidizing ambient, or it is a grown chemical oxide layer with or without previous thermal treatment.

For the thermal treatment, different conditions concerning the composition of the non-oxidizing ambient and the temperature are indicated in FIG. 2.

Said chemical oxide is formed either by performing said wet $O_3$/DIW-last cleaning treatment (also called IMEC-clean) or said UV-enhanced oxide growth method (labeled UV/Air/Ar in FIG. 2).

FIG. 2 shows very good results for the thickness for both the interfacial layer and the deposited high-k dielectric $HfO_2$ layer performing only said thermal treatment.

For example the $H_2$/He/1050° C. thermal treatment and the He/1050° C. thermal treatment form an ultrathin interfacial layer of 0.4 nm and 0.5 nm respectively.

Furthermore, as depicted in FIG. 2, the $H_2$/He/1050° C. thermal treatment helps to limit the following chemical oxide growth.

Thus, the method according to the invention can be used for achieving EOT scaling.

In the case of forming an interfacial layer as a result of performing said thermal treatment combined with a chemical oxide growth by said UV-enhanced oxide growth method, the thickness of the total oxide layer is also lower than in the case of performing only a chemical oxide growth via said UV-enhanced oxide growth method.

Figure 3:
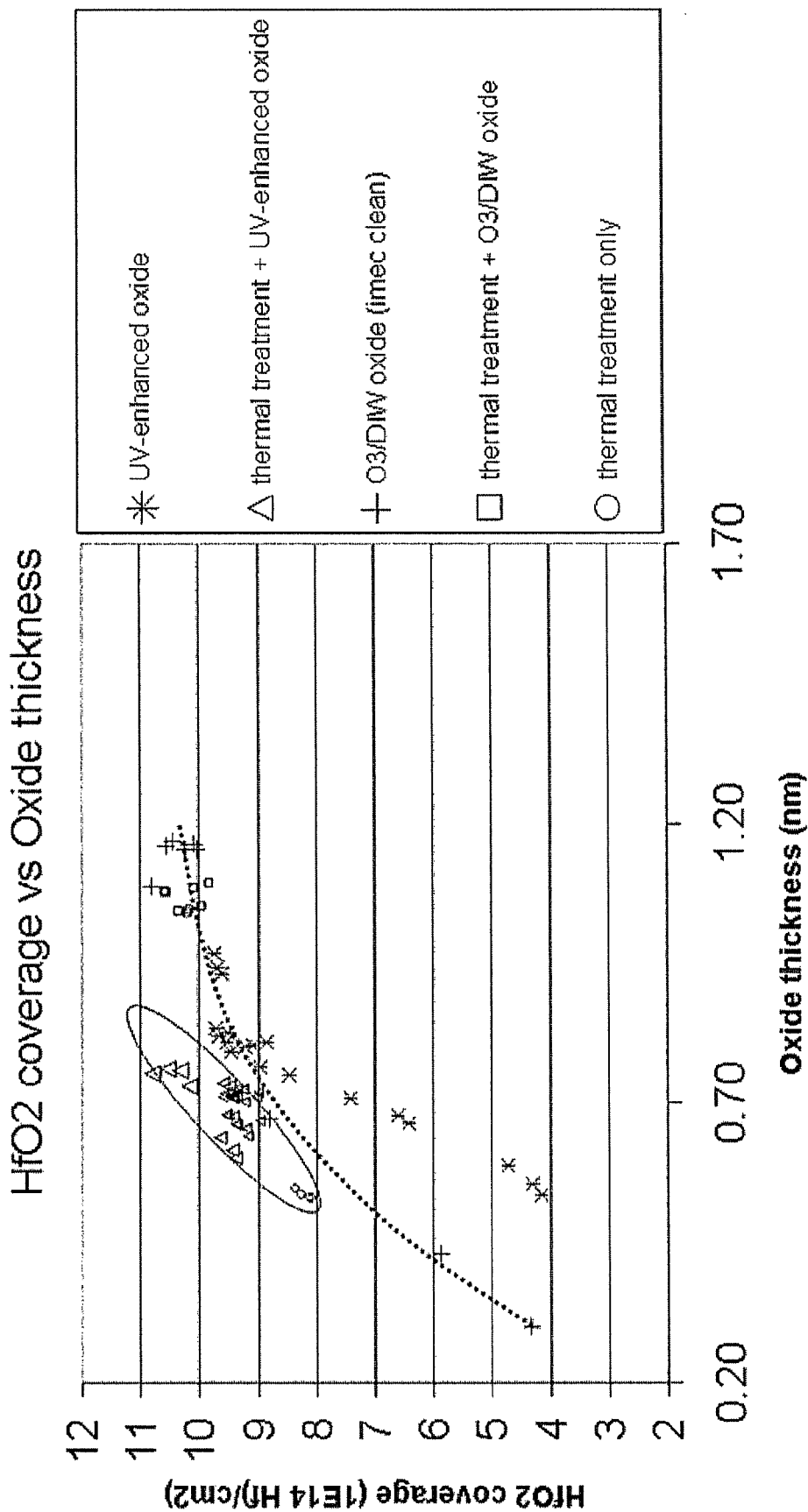
FIG. 3 represents the HfO2 coverage versus oxide thickness.

But, as shown in FIG. 3, performing said UV-enhanced oxide growth method yields a lower $HfO_2$ coverage than performing said thermal treatment in combination with said UV-enhanced oxide growth. A possible explanation is that the UV-enhanced oxide does not show enough appropriate active group terminations (e.g. OH-bonds) on the surface, which makes it a rough and low quality nucleation layer for the following high-k material deposition step and, as such, yielding problems in electrical properties of the resulting devices.

Indeed, FIG. 3 represents the $HfO_2$ coverage (atoms/cm2) versus oxide thickness according to the present invention.

The interfacial layer is formed by performing said thermal treatment optionally followed by said chemical oxide formation (performed by said UV-enhanced oxide growth method or by said wet $O_3$/DIW-last treatment (IMEC-clean)).

Said interfacial layer formation is then followed by, e.g., a five cycle ALD $HfO_2$ monolayer deposition.

The ALD technique in general, and ALD of $HfO_2$ in particular, is sensitive to the interfacial layer surface conditions, and as such, by performing ALD of $HfO_2$, the interface layer quality is evaluated according to its roughness, the termination of the active groups on its surface (e.g., OH-bonds), and the continuity/uniformity of the interfacial layer (e.g., not-island-like).

Accordingly, more OH-group termination on the surface and smoother (lower roughness) interfacial layer is preferred by ALD of $HfO_2$.

As shown in FIG. 3, performing said thermal treatment forming said interfacial layer (combined with or without performing said UV-enhanced oxide growth method) provides the best $HfO_2$ coverage and thus a good quality, smooth interfacial layer.

Said $HfO_2$ coverage is also higher than the one obtained by performing O3/DIW chemical oxide growth (combined with or without thermal treatment forming interfacial layer), and especially improving the poor coverage obtained by performing said UV-enhanced oxide growth method only.

Figure 4:
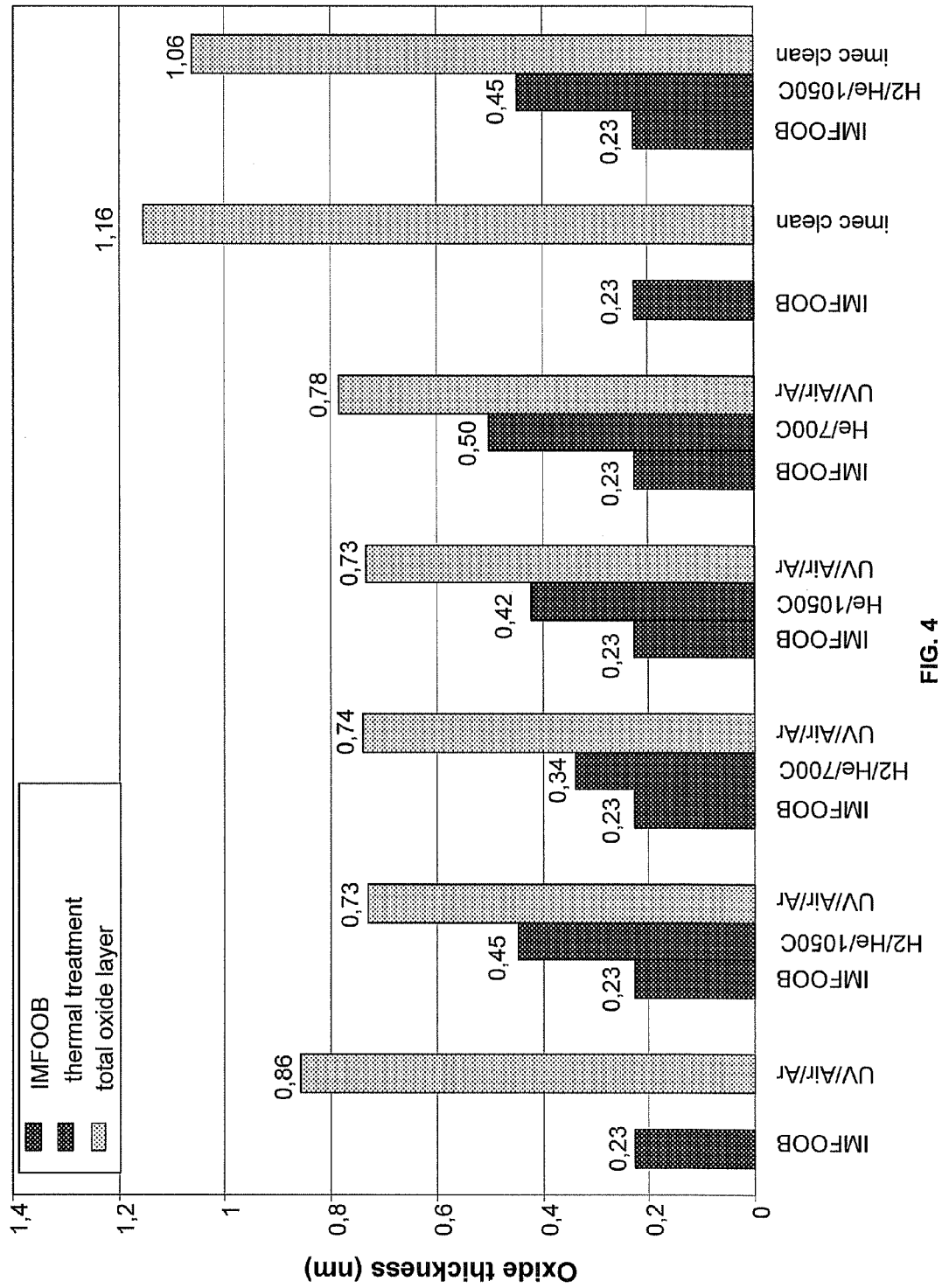
FIG. 4 represents the step-by-step oxide growth measured by Ellipsometry.

FIG. 4 represents the step-by-step oxide thickness (measured by Ellipsometry) for different surface treatment steps according to the disclosed methods.

Each time, a cleaning step is performed (IMFOOB) followed either by a thermal treatment in a non-oxidizing ambient, or by a chemical oxide growth (wet $O_3$/DIW-last clean (IMEC clean) or UV/Air/Ar), or by a combination of both.

For the formation of the interfacial layer as a result of the thermal treatment, different conditions are indicated concerning the composition of the non-oxidizing ambient and the temperature.

The chemical oxide is grown by performing said UV-enhanced oxide growth method or by a wet $O_3$/DIW-last treatment (IMEC clean).

The total oxide layer depicted in FIG. 4 is measured upon forming said interfacial layer yielded by performing said thermal treatment in said non-oxidizing ambient and said chemical oxide layer grown by performing either said wet $O_3$/DIW-last clean (IMEC-clean) treatment or said UV-enhanced oxide growth method.

Here, it has to be noticed that optical Ellipsometry is not as precise as AR-XPS for measuring the oxide thickness for thin layers.

In fact, the thickness measured by Ellipsometry is thicker than the corresponding thickness measured via AR-XPS.

But, the trend as shown in FIG. 4 is in agreement with the results shown in FIG. 2.

Figure 5:
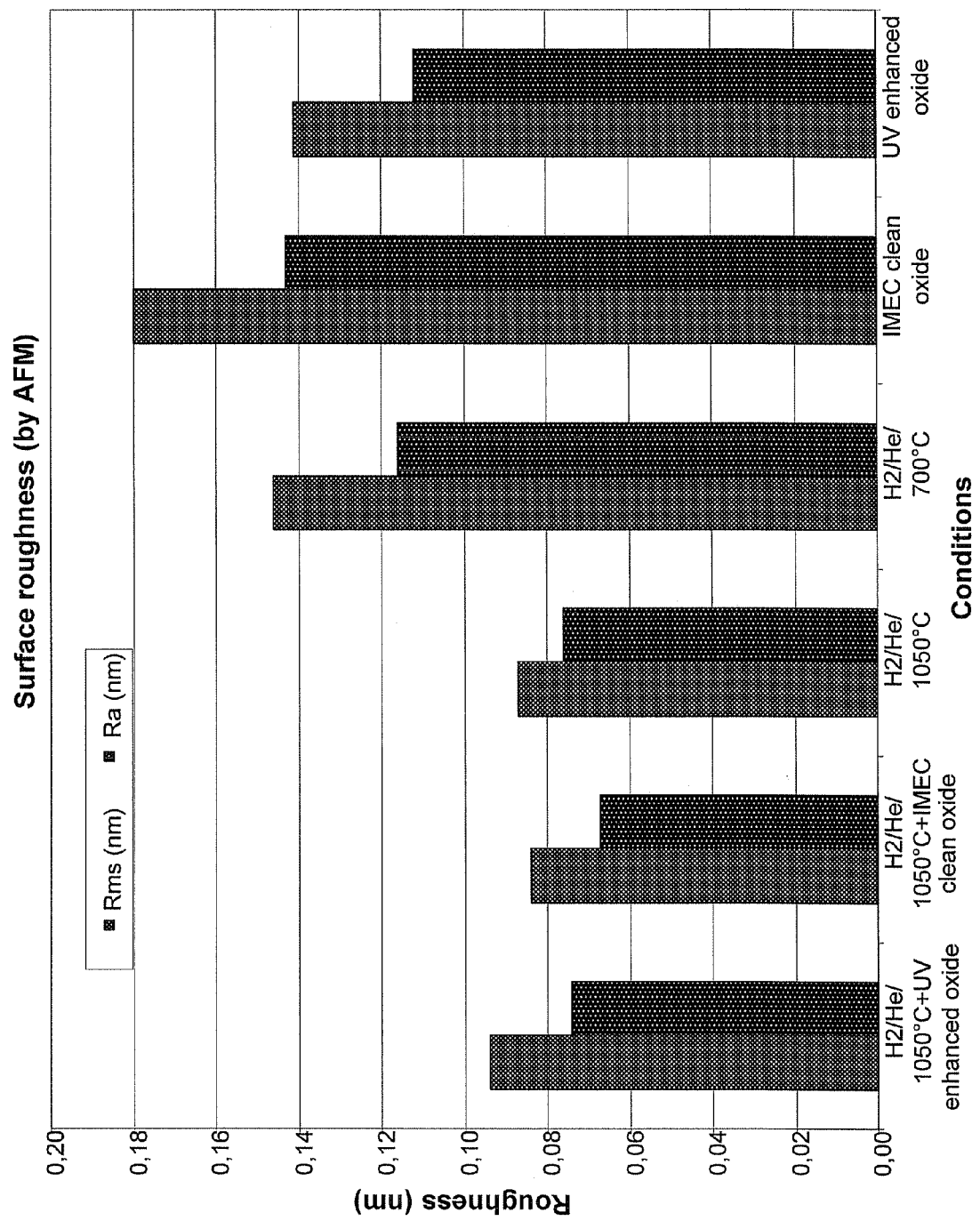
FIG. 5 depicts a surface roughness check by Atomic Force Microscope (AFM).

FIG. 5 depicts a surface roughness measurement by Atomic Force Microscope (AFM).

Either a thermal treatment is performed yielding an interfacial layer and/or a chemical oxide is grown.

For the formation of the interfacial layer as a result of the thermal treatment, different conditions are indicated concerning the composition of the non-oxidizing ambient and the temperature.

The chemical oxide is grown by performing said UV-enhanced oxide growth method or by a wet $O_3$/DIW treatment (Imec clean).

As shown in FIG. 5, a chemical oxide layer grown using only said UV-enhanced oxide growth method or only an $O_3$/DIW treatment, thus treatments without performing a thermal (pre)treatment forming an interfacial layer, yield relative rough surfaces of the oxide layer. For example, the chemical oxide formed by a wet $O_3$/DIW-last clean (Imec clean) has an Rms=0.18 nm, while the UV-enhanced chemical oxide has an Rms=0.14 nm, Rms being measured each time for a 1×1 μm scale.

On the contrary, performing a $H_2$/He/1050° C. thermal treatment forming an interfacial layer helps to smooth the surface of said thin interfacial layer and of the chemical oxide layer formed upon it, achieving Rms values of 0.08 to 0.09 nm for a 1×1 μm scale.

Furthermore, a lower temperature treatment (e.g. 700° C.) will degrade the surface smoothing performance (Rms=0.146 nm for a 1×1 μm scale).

Figure 6:
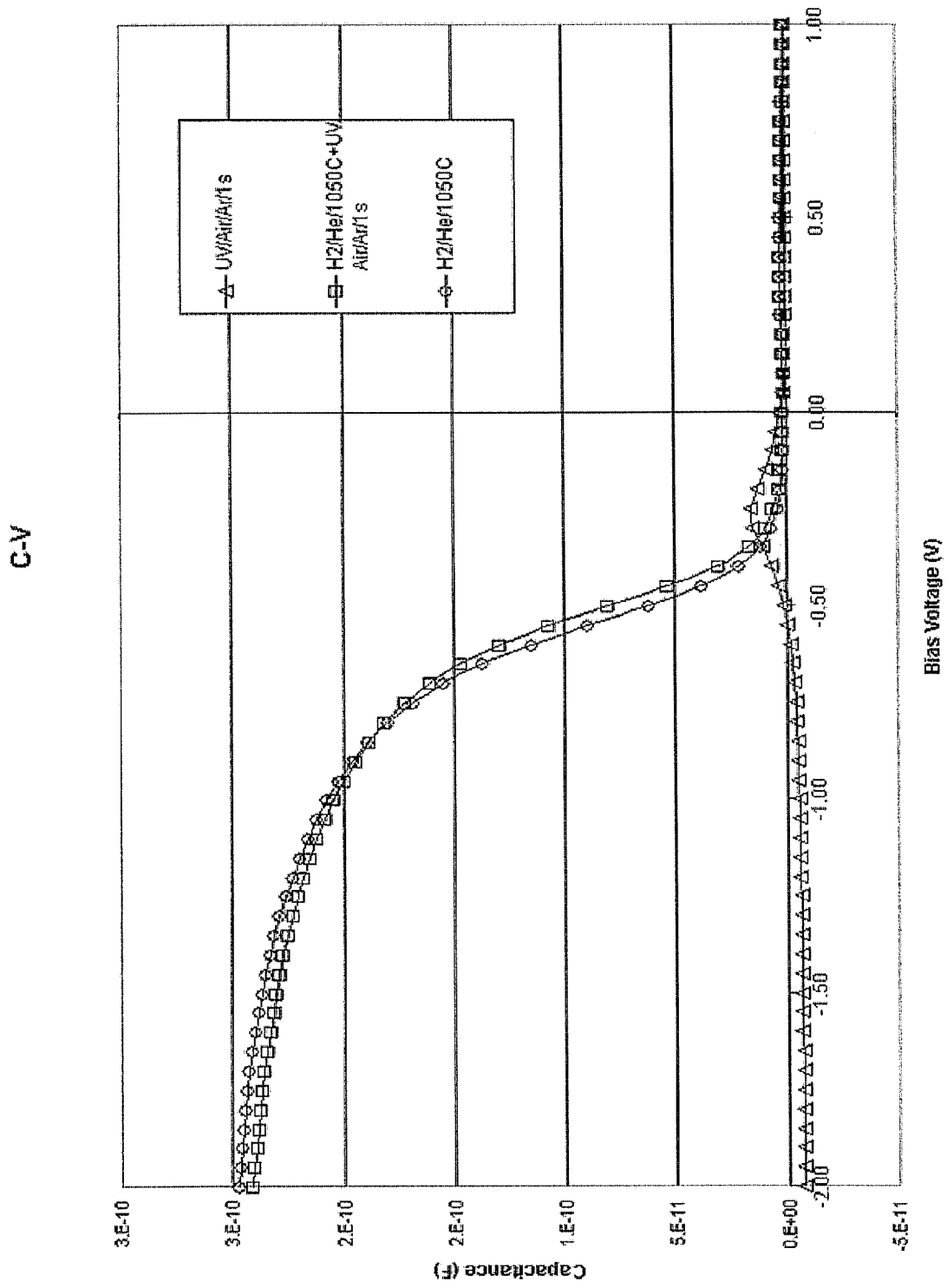
FIG. 6 is a capacitance versus voltage curve for different surface treatments.

A capacitance versus voltage curve for the case of thermal treatment only, chemical oxide growth only, or the combination thermal treatment and chemical oxide growth (UV-enhanced oxide labelled as UV/Air/Ar/1s) is shown in FIG. 6.

The capacitor (MOS) is a p-type substrate having a TaN/TiN metal gate electrode.

Either a $H_2$/He/1050° C. thermal treatment is performed and/or said UV-enhanced oxide growth method is performed, followed by a 40 cycle ALD $HfO_2$ monolayer deposition.

From FIG. 6, it is shown that only performing said UV-enhanced oxide growth method yields a very leaky, thin oxide layer.

The leakage is suppressed by forming first an interfacial layer with or without performing said UV-enhanced oxide growth method.

Figure 7:
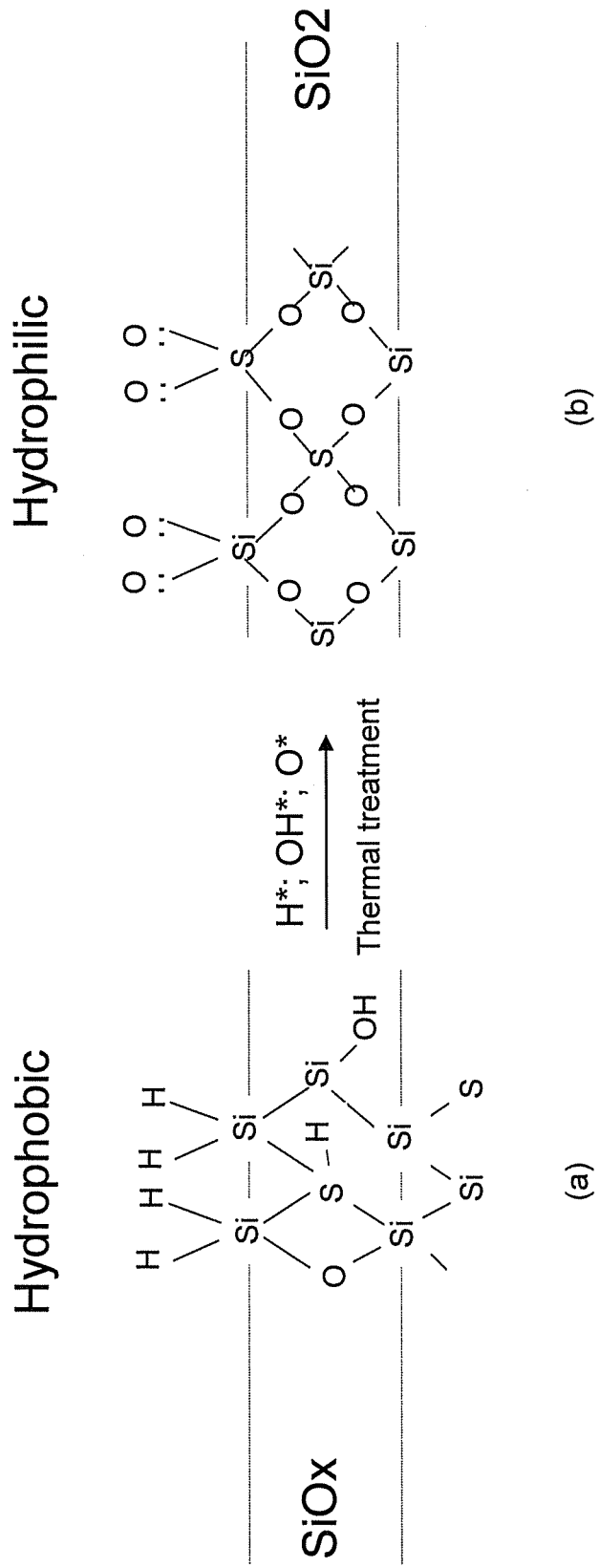
FIG. 7 shows schematically a possible mechanism for the thin interfacial layer formation.

FIG. 7 shows schematically a possible mechanism for the thin interfacial layer formation. The cleaning sequence comprises a HF-last hydrophobic treatment that leave a hydrogen terminated surface (Si—H bonds, FIG. 7a), that are suppressing the oxygen radical to combine with the silicon top layer. In the presence of water (during the rinse step), dissolved $O_2$ and/or OH-radicals may attack the interior Si—Si bonds without breaking the Si—H bonds, leaving $SiO_x$ sub-oxides under the (oxide-free) surface. During the thermal treatment, a thin layer comprising silicon oxides and sub-oxides ($SiO_x$ with 0<x≤2) is unraveled on the silicon surface (FIG. 7b). The thin layer is continuous (no islands formations), uniform and hydrophilic, being a suitable interface layer between the substrate and the high-k materials (e.g. Hf-oxides) deposited with ALD.

Methods for producing a uniform ultrathin interfacial layer underneath materials of high dielectric permittivity (i.e. high-k materials) have been disclosed.

As such, the disclosed methods can be used for yielding a uniform and thin interfacial layer with suitable terminations (e.g. OH-bonds) making it compatible with the following high-k material deposition step.

Furthermore, carrying out the disclosed methods improves interfacial layer roughness and quality.

At the same time, in the framework of the disclosed methods, the mobility of the charge carriers in the semiconductor device is enhanced.

We claim:
1. A method for forming a high-k gate dielectric, comprising the steps of:
   providing a semiconductor substrate;
   cleaning the substrate, wherein the cleaning comprises a HF-last hydrophobic treatment that comprises an oxidation step using at least $O_3$ and DIW followed by an oxide removal step using at least HF/HCl;
   performing a high-k dielectric material deposition; and
   after said cleaning but prior to said high-k dielectric material deposition, performing a thermal treatment in a non-oxidizing ambient comprising a proportion of $H_2$ and excluding $N_2$ leading to the formation of a thin interfacial layer comprising silicon oxide and sub-oxides between said semiconductor substrate and said high-k dielectric material and wherein the thickness of said thin interfacial layer is less than 10 Å.

2. The method according to claim 1, wherein said thermal treatment is performed at a temperature higher than 700° C.

3. The method according to claim 1, wherein said thermal treatment is performed at a temperature higher than 1050° C.

4. The method according to claim 1, wherein said non-oxidizing ambient comprises an inert gas, preferably He and/or Ar.

5. The method according to claim 1, wherein said proportion of the $H_2$ gas is by volume less than 10%, and preferably comprised between 1 and 10%.

6. The method according to claim 1, wherein the duration of the thermal treatment is less than 2 minutes.

7. The method according to claim 1, wherein the duration of the thermal treatment is less than 40 seconds.

8. The method according to claim 1, wherein said thermal treatment is followed by forming a thin chemical oxide layer.

9. The method according to claim 8, wherein said thin chemical oxide layer is formed by performing a wet $O_3$/DIW-last treatment or a UV-enhanced oxide growth method.

10. The method according to claim 1, wherein the high-k dielectric material is any dielectric material with a dielectric constant, k, higher than the dielectric constant of $SiO_2$.

11. The method according to claim 1, wherein the high-k dielectric material is deposited by Atomic Layer Deposition.

12. The method according to claim 1, wherein the high-k dielectric material deposition is followed by a post deposition anneal.

13. The method according to claim 1, wherein the thickness of the thin interfacial layer is less than 0.6 nm.

14. The method according to claim 1, wherein the HF-last hydrophobic treatment further comprises a DIW rinse step with HCl spiking followed by a drying step with IPA and $N_2$.

15. The method according to claim 1, wherein the thin interfacial layer comprising silicon oxide and sub-oxides between said semiconductor substrate and said high-k dielectric material is hydrophilic.

* * * * *